(12) United States Patent
Wu et al.

(10) Patent No.: US 12,512,441 B2
(45) Date of Patent: Dec. 30, 2025

(54) SEMICONDUCTOR DEVICE

(71) Applicant: Shanghai Xizhi Technology Co., Ltd., Shanghai (CN)

(72) Inventors: Jianhua Wu, Shanghai (CN); Cheng-Kuan Lu, Shanghai (CN); Huaiyu Meng, Shanghai (CN); Yichen Shen, Shanghai (CN)

(73) Assignee: Shanghai Xizhi Technology Co., Ltd., Shanghai (CN)

( * ) Notice: Subject to any disclaimer, the term of this patent is extended or adjusted under 35 U.S.C. 154(b) by 598 days.

(21) Appl. No.: 17/955,778

(22) Filed: Sep. 29, 2022

(65) Prior Publication Data

US 2023/0099534 A1 Mar. 30, 2023

(30) Foreign Application Priority Data

Sep. 30, 2021 (CN) .......................... 202111162695.X

(51) Int. Cl.
*H01L 25/065* (2023.01)
*H01L 23/538* (2006.01)
*H01L 23/31* (2006.01)

(52) U.S. Cl.
CPC ...... *H01L 25/0657* (2013.01); *H01L 23/5384* (2013.01); *H01L 23/5386* (2013.01); *H01L 23/3128* (2013.01)

(58) Field of Classification Search
CPC ............. H01L 25/0657; H01L 23/5384; H01L 23/5386
See application file for complete search history.

(56) References Cited

U.S. PATENT DOCUMENTS

| 11,982,853 | B2* | 5/2024 | Lin | .......................... H01L 24/13 |
| 12,237,290 | B2* | 2/2025 | Jang | .......................... H01L 24/20 |
| 12,261,161 | B2* | 3/2025 | Templier | .............. H10H 20/018 |
| 2002/0041027 | A1 | 4/2002 | Sugizaki | |

(Continued)

FOREIGN PATENT DOCUMENTS

| CN | 201342587 A | 10/2013 |
| CN | 112086444 A | 12/2020 |

(Continued)

OTHER PUBLICATIONS

Taiwan Office Action issued in corresponding Taiwan Patent Application No. 111137114 dated Oct. 13, 2023.

(Continued)

*Primary Examiner* — Thao P Le
(74) *Attorney, Agent, or Firm* — Rivka Friedman

(57) ABSTRACT

The present invention relates to a field of photonic integrated circuits, which provides a semiconductor device. In some embodiments, the semiconductor device includes: a PIC chip including a conductive structure in a via; a first electronic integrated circuit chip (i.e., first EIC chip) arranged on a first surface of the PIC chip; a second electronic integrated circuit chip (i.e., second EIC chip) arrange on a second surface of the PIC chip; wherein the first EIC chip is electrically connected to the second EIC chip through the conductive structure in the via of the PIC chip. The semiconductor device of the present invention optimizes wiring of the PIC chip and can suppress a voltage drop caused by quite a long wire, optimizing a package structure.

18 Claims, 3 Drawing Sheets

(56) References Cited

U.S. PATENT DOCUMENTS

| | | |
|---|---|---|
| 2008/0258259 A1 | 10/2008 | Osaka et al. |
| 2019/0326266 A1 | 10/2019 | Traverso |
| 2021/0064958 A1 | 3/2021 | Lin et al. |
| 2021/0096310 A1 | 4/2021 | Chang et al. |
| 2021/0202562 A1 | 7/2021 | Chang et al. |
| 2021/0288025 A1* | 9/2021 | Arvin ................. H01L 21/56 |
| 2021/0407909 A1* | 12/2021 | Jadhav ............... H01L 25/167 |
| 2022/0165651 A1* | 5/2022 | Kwak ................ H01L 23/5389 |
| 2022/0293563 A1* | 9/2022 | Ko ..................... H01L 23/3135 |
| 2022/0293565 A1* | 9/2022 | Shin .................. H01L 23/49838 |
| 2022/0344287 A1* | 10/2022 | Yu ...................... H01L 23/645 |
| 2023/0058497 A1* | 2/2023 | Suk ................... H01L 23/49822 |
| 2025/0105231 A1* | 3/2025 | Kang ................. H01L 23/13 |

FOREIGN PATENT DOCUMENTS

| | | |
|---|---|---|
| CN | 113035858 A | 6/2021 |
| CN | 113053835 | 6/2021 |
| CN | 113192937 A | 7/2021 |
| TW | 201342587 A | 10/2013 |
| TW | 201629559 A | 8/2016 |
| TW | 202125789 A | 7/2021 |

OTHER PUBLICATIONS

Taiwan Disposition of Refusal issued in corresponding Taiwan Patent Application No. 111137114 dated Feb. 6, 2024.

Chinese Office Action issued in corresponding Chinese Patent Application No. 202111162695.X dated Mar. 8, 2023, pp. 1-4.

Chinese Notice of Allowance issued in corresponding Chinese Patent Application No. 202111162695.X dated May 15, 2023, pp. 1-4.

Taiwan Office Action issued in corresponding Taiwan Patent Application No. 111137114 dated Jul. 5, 2023, pp. 1-8.

The First Office Action and Search Report Dated Jan. 13, 2022, for Shanghai Xizhi Technology Co., Ltd, from China Application No. 202111162695.X (7 pages).

\* cited by examiner

SEMICONDUCTOR DEVICE

CROSS-REFERENCE TO RELATED APPLICATIONS

This application claims priority to Chinese Patent Application No. 202111162695.X filed on Sep. 30, 2021, titled "SEMICONDUCTOR DEVICE", which is incorporated by reference in its entirety in the present application.

TECHNICAL FIELD

The present invention relates to a field of photonic integrated circuits, and more particularly, to a semiconductor device.

BACKGROUND

In recent years, with rapid development of artificial intelligence technology, some neural network algorithms involved require a large number of matrix operations. At present, it has been proposed to use photonic computing to perform the above operations. The photonic computing uses light as an information carrier, and realizes light transmission, processing, and calculation through optical devices/chips.

In an existing solution for implementing a photonic computing system, an electronic integrated circuit (EIC) chip and a photonic integrated circuit (PIC) chip need to be electrically connected. Since the chips are relatively large, connection lines are relatively long. Due to existence of resistance, a voltage drop caused by a current flowing through the long connection lines is not negligible and leads to extra power consumption. An excessive voltage drop may cause the system to fail to work properly. In addition, in application scenarios such as photonic computing chips, in order to realize transmission and electrical connection of a large amount of data and signals, both the EIC chip and the PIC chip have multiple connection points, and a large number of connection points correspond to a large number of wiring lines, which further leads to an unnecessary voltage drop. In addition, the PIC chip sometimes needs to have optical coupling with outside, which greatly limits integration of a semiconductor device as a whole. Appropriate packaging of the PIC chip is a technical problem, which has been expected to be solved in the art in recent years.

SUMMARY

The present invention provides a semiconductor device, which can effectively suppress a voltage drop, optimize an electrical connection between PIC and EIC chips, and optimize a package size.

According to one aspect of the present invention, an embodiment of the present invention relates to a semiconductor device, including:
- a photonic integrated circuit (PIC) chip including a conductive structure in a via;
- a first electronic integrated circuit (EIC) chip arranged on a first surface of the PIC chip; and
- a second EIC chip arranged on a second surface of the PIC chip;
- wherein the first EIC chip is electrically connected to the second EIC chip through the conductive structure in the via of the PIC chip.

In some embodiments, the first EIC chip includes an electrical signal conversion unit. The PIC chip includes an optical matrix computing unit and a first wiring structure. An electrical signal transmission channel is formed between the second EIC chip and the optical matrix computing unit of the PIC chip. The conductive structure in the via in the PIC chip, the electrical signal conversion unit of the first EIC chip, and the first wiring structure of the PIC chip are passed through in sequence along the electrical signal transmission channel in a direction from the second EIC chip to the optical matrix computing unit of the PIC chip. The electrical signal transmission channel is used for data transmission between the optical matrix computing unit of the PIC chip and the second EIC chip.

In some embodiments, the semiconductor device includes a first bonding structure configured to electrically connect the first EIC chip to the PIC chip, and configured to satisfy that the conductive structure in the via in the PIC chip, the first bonding structure, and the electrical signal conversion unit of the first EIC chip are passed through in sequence along the electrical signal transmission channel in the direction from the second EIC chip to the optical matrix computing unit of the PIC chip.

In some embodiments, the semiconductor device includes a second bonding structure configured to electrically connect the second EIC chip to the PIC chip.

In some implementations, the semiconductor device includes a third bonding structure configured to electrically connect the first EIC chip to the PIC chip, and to satisfy that the electrical signal conversion unit of the first EIC chip, the third bonding structure, and the first wiring structure of the PIC chip are passed through in sequence along the electrical signal transmission channel in the direction from the second EIC chip to the optical matrix computing unit.

In some embodiments, in the semiconductor device, the conductive structure in the via passes through a part of the PIC chip, but does not pass through the whole PIC chip. Optionally, the PIC chip includes a through silicon via (TSV), and at least a part of the conductive structure in the via is located in the TSV.

According to another aspect of the present invention, an embodiment of the present invention relates to a semiconductor device comprising:
- a substrate;
- a PIC chip including a conductive structure in a via, wherein the PIC chip is mounted on the substrate, the PIC chip has a first surface and a second surface, and the second surface faces towards the substrate;
- an interposer including a wiring structure, wherein the interposer is mounted on the substrate, and the interposer has a third surface facing towards the substrate and a fourth surface opposite to the third surface;
- a first EIC chip, wherein a part of the first EIC chip is mounted on the first surface of the PIC chip, and another part of the first EIC chip is mounted on the fourth surface of the interposer; and
- a second EIC chip mounted on the fourth surface of the interposer.

In some embodiments, the conductive structure in the via in the PIC chip is configured to electrically connect the substrate to the first EIC chip. The wiring structure of the interposer is configured to electrically connect the first EIC chip to the second EIC chip.

In some embodiments, the first EIC chip includes an electrical signal conversion unit. The PIC chip includes an optical matrix computing unit and a first wiring structure. An electrical signal transmission channel is formed between the second EIC chip and the optical matrix computing unit of the PIC chip. The wiring structure of the interposer and the electrical signal conversion unit of the first EIC chip are passed through in sequence along the electrical signal transmission channel in a direction from the second EIC chip to the optical matrix computing unit of the PIC chip. The electrical signal transmission channel is used for data transmission between the optical matrix computing unit of the PIC chip and the second EIC chip.

In some embodiments, the PIC chip includes a grating coupler.

According to the embodiment of the present invention, the PIC chip is arranged between the first EIC chip and the second EIC chip, and the first EIC chip is electrically connected to the second EIC chip through a wiring structure (such as the conductive structure in the via) formed in the PIC chip. This reduces a line distance from the first EIC chip to the second EIC chip, thereby reducing a voltage drop. Moreover, the above configuration also reduces an electrical signal transmission distance from the second EIC chip to the PIC chip, suppresses a signal drop, and improves information transmission and processing rates. In addition, the interposer and the conductive structure in the via can be used to reduce a connection distance between a chip on the interposer and the substrate, which can also reduce the voltage drop and improve performance of the semiconductor device. Optical coupling is carried out through the grating coupler of the PIC, which improves an integration degree of the semiconductor device.

Various aspects, features, advantages, etc., of the embodiments of the present invention will be described in detail below with reference to accompanying drawings. The above aspects, features, advantages, etc., of the present invention will become more apparent from the following detailed description in conjunction with the accompanying drawings.

DETAILED DESCRIPTION OF PREFERRED EMBODIMENTS

In order to facilitate understanding of various aspects, features, and advantages of technical solutions of the present invention, the present invention will be described in detail below with reference to accompanying drawings. It should be understood that the following various embodiments are only used for illustration, but not for limiting the protection scope of the present invention.

Embodiment 1

Figure 1:
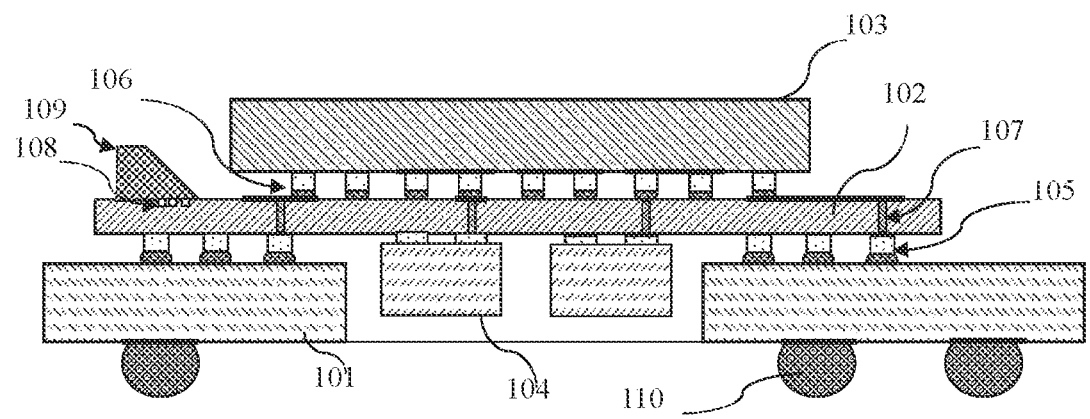
FIG. 1 is a cross-sectional view illustrating a structure of a semiconductor device according to an embodiment of the present invention.

FIG. 1 illustrates a structure of a semiconductor device according to an embodiment of the present invention.

In an embodiment of the present invention, the semiconductor device includes a substrate 101, a photonic integrated circuit (PIC) chip 102, a first electronic integrated circuit (EIC) chip 103, and a second EIC chip 104.

The PIC chip 102 is mounted on the substrate 101. Optionally, the PIC chip 102 is mounted on the substrate 101 through a bonding structure 105.

In an alternative embodiment, the bonding structures 105 include a microbump formed of solder. In the embodiment of the present invention, the PIC chip 102 has a first surface and a second surface opposite to the first surface. The first EIC chip 103 is mounted on the first surface, and the second EIC chip 104 is mounted on the second surface. The second surface faces towards the substrate 101. In the embodiment of the present invention, the first EIC chip 103 and the second EIC chip 104 are located on upper and lower surfaces of the PIC chip 102, respectively. That is, the first EIC chip 103 and the second EIC chip 104 are arranged to sandwich the PIC chip 102. In some embodiments, at least one of the first EIC chip 103 and the second EIC chip 104 is mounted on the PIC chip in an inverted manner. The first EIC chip 103 is mounted on the PIC chip 102 through a bonding structure 106. Similarly, the second EIC chip 104 can also be mounted on the PIC chip 102 through another bonding structure. In an alternative embodiment, the bonding structure 106 includes a microbump formed of solder. Another bonding structure may be, for example, a solder material layer. In other alternative embodiments, any one of the aforementioned bonding structures may be other bonding structures such as solder balls. In an embodiment of the present invention, the substrate 101 has an opening for accommodating the second EIC chip 104. Optionally, in the opening, an encapsulation material (e.g., molding compound) may be arranged around the second EIC chip 104.

In the embodiment of the present invention, the first EIC chip 103 is connected to an object circuit through a wiring structure arranged in the PIC chip 102. The object circuit includes the second EIC chip 104 and a wiring structure in the substrate 101. The PIC chip 102 includes a conductive structure 107 in a via. In an embodiment of the present invention, the first EIC chip 103 includes a first EIC wiring layer (e.g., shown by a thick solid line in FIG. 1) connected to the bonding structure 106. The wiring structure of the PIC chip 102 also includes a PIC wiring layer (e.g., shown by a thick solid line in FIG. 1) connected to the bonding structure 106. An electrical connection path from the first EIC chip 103 to the second EIC chip 104 includes an electrical connection path successively passing through the first EIC wiring layer, the bonding structure 106, the PIC wiring layer, the conductive structure 107 in the via, and the second EIC chip 104. An electrical connection path from the first EIC chip 103 to the substrate 101 includes an electrical connection path successively passing through the first EIC wiring layer, the bonding structure 106, the PIC wiring layer, the conductive structure 107 in the via, and the substrate 101. The wiring of this embodiment is simple, requires a relatively short wire, and reduces a voltage drop.

In some embodiments, the PIC chip 102 may include a first wiring structure (not shown in FIG. 1) configured to electrically connect the first EIC chip 103 to the conductive structure 107 in the via in the PIC chip 102. The PIC chip 102 may also include a second wiring structure configured to electrically connect the second EIC chip 104 to the conductive structure 107 in the via in the PIC chip 102. The PIC chip 102 may further include a third wiring structure configured to electrically connect the first EIC chip 103 to a device layer in the PIC chip 102. When the second EIC chip 104 is electrically connected to the device layer of the PIC chip 102, the second EIC chip 104 is electrically connected to the device layer of the PIC chip 102 through the second wiring structure, the conductive structure 107 in the via, the first wiring structure, and the third wiring structure in sequence, forming a conductive channel between the second EIC chip 104 and the device layer of the PIC chip 102. Through the conductive channel, an electrical signal may be transmitted between the device layer of the PIC chip 102 and the second EIC chip 104. Exemplarily, some (e.g., light modulators, photodiodes (PDs)) of devices in the device layer can be electrically coupled (electrically connected).

Exemplarily, the first EIC chip 103 includes an electrical signal conversion unit. The PIC chip 102 includes an optical matrix computing unit and the first wiring structure. An electrical signal transmission channel is formed between the second EIC chip 104 and the optical matrix computing unit of the PIC chip 102. The conductive structure 107 in the via in the PIC chip 102, the electrical signal conversion unit of the first EIC chip 103, and the first wiring structure of the PIC chip 102 are passed through in sequence along the electrical signal transmission channel in a direction from the second EIC chip 104 to the optical matrix computing unit. The electrical signal transmission channel is used for data transmission between the optical matrix computing unit of the PIC chip 102 and the second EIC chip 104. By forming the conductive structure 107 in the via, wiring and electrical signals/data transmission are optimized. In addition, the data is transmitted from the second EIC chip 104 to the first EIC chip 103 for processing such as signal conversion, and then transmitted to the PIC chip 102. Each chip can be independently designed and manufactured and complete their respective functions, and multi-chip integration can realize an overall function. Exemplarily, a space between the first EIC chip 103 and the PIC chip 102 does not arrange (stack) other chips, so that a connection distance between the chips can be reduced. Similarly, a space between the second EIC chip 104 and the PIC chip 102 does not arrange (stack) other chips.

In some embodiments, the semiconductor device includes a first bonding structure configured to electrically connect the first EIC chip 103 to the PIC chip 102. The semiconductor device may include a second bonding structure configured to electrically connect the second EIC chip 104 to the PIC chip 102. Exemplarily, the second EIC chip 104 is electrically connected to the device layer through the second wiring structure, the second bonding structure, the conductive structure 107 in the via, the first wiring structure, the first bonding structure, the first EIC chip, and the third wiring structure in sequence along the electrical signal transmission channel in the direction from the second EIC chip to the optical matrix computing unit.

Exemplarily, the PIC chip 102 is configured to receive an electrical signal of the first EIC chip 103, generate a first optical signal based on the electrical signal of the first EIC chip 103, and perform computation by using the first optical signal, that is, optical computation. The PIC chip 102 may include an electro-optical conversion unit. The electro-optical conversion unit can be an optical modulator. The optical modulator can modulate an original optical signal into the above-mentioned first optical signal based on the electrical signal. Exemplarily, an optical processor can use light as a signal to perform matrix computation. The first optical signal may represent data in a form of a vector, a matrix, or the like, and perform the computation on the data. Exemplarily, the first EIC chip 103 includes the electrical signal conversion unit. The signal conversion unit can realize conversion of the electrical signal, for example, conversion between the first electrical signal and the second electrical signal. Exemplarily, the first electrical signal and the second electrical signal may be selected from a current signal, a voltage signal, a digital signal, an analog signal, or the like. Exemplarily, the first electrical signal comes from the PIC chip 102, and the second electrical signal is output to the second EIC chip 104. Exemplarily, the first electrical signal comes from the second EIC chip 104, the second electrical signal is output to the PIC chip 102, and the PIC chip 102 generates the first optical signal based on the second electrical signal.

In some embodiments, an opening structure is arranged on the substrate 101 for accommodating the second EIC chip 104, which reduces a package size/package area.

In one embodiment, the PIC chip 102 includes a grating coupler 108 that can couple light from a laser chip through a light redirecting mirror 109, such as a prism. In an alternative embodiment, the grating coupler 108 may be coupled to a fiber array to couple light from a light source external to a package of the PIC chip 102.

In an embodiment of the present invention, the substrate 101 has solder balls 110 for mounting the semiconductor device on other devices (such as a printed circuit board).

In some embodiments, the first EIC chip 103 may include a digital integrated circuit chip and/or an analog integrated circuit chip. In some embodiments, the second EIC chip 104 may include a memory chip, e.g., one or more HBM chips.

Embodiment 2

Figure 2:
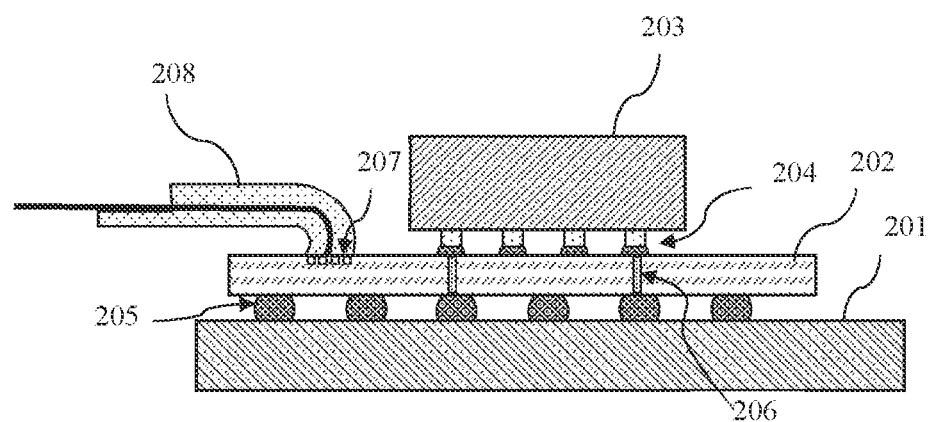
FIG. 2 is a cross-sectional view illustrating the structure of the semiconductor device according to another embodiment of the present invention.

FIG. 2 illustrates a structure of the semiconductor device according to another embodiment of the present invention. The semiconductor device includes a substrate 201, a PIC chip 202, and an EIC chip 203. The PIC chip 201 is mounted on the substrate 201 through solder balls 205 (as an example of a bonding structure). The PIC chip 201 includes a first surface facing toward the substrate 201 and a second surface opposite to the first surface. On the second surface, the EIC chip 203 is mounted on the PIC chip 202 through a bonding structure 204. The EIC chip 203 is electrically connected to an object circuit through a wiring structure arranged in the PIC chip 202. The object circuit includes a wiring structure arranged in the substrate 201. In some embodiments, the wiring structure arranged in the PIC chip 202 includes a conductive structure 206 in a via. Although not shown, those skilled in the art should understand that the EIC chip 203 has an EIC wiring layer, the wiring structure of the PIC chip 202 includes a PIC wiring layer, and the substrate 201 has a substrate wiring layer. An electrical connection path from the EIC chip 203 to the substrate 201 includes an electrical connection path successively passing through the EIC wiring layer, the bonding structure 204, the first wiring structure of the PIC chip 202, the conductive structure 206 in the via of the PIC chip, the solder balls 205, and the substrate wiring layer. This embodiment has simple wiring and a relatively short wire, and thus a voltage drop is reduced.

In some embodiments, the PIC chip 202 includes a grating coupler 207, through which the PIC chip 202 is coupled to a fiber array 208 to couple light from a light source external to a package of the PIC chip 202. In an alternative embodiment, the grating coupler 207 can be connected to a light redirecting mirror, so as to directly receive a light emitted by a laser chip in the package of the PIC chip 202 through the light redirecting mirror.

In some embodiments, the EIC chip 203 may include a digital integrated circuit chip and an analog integrated circuit chip.

Embodiment 3

Figure 3:
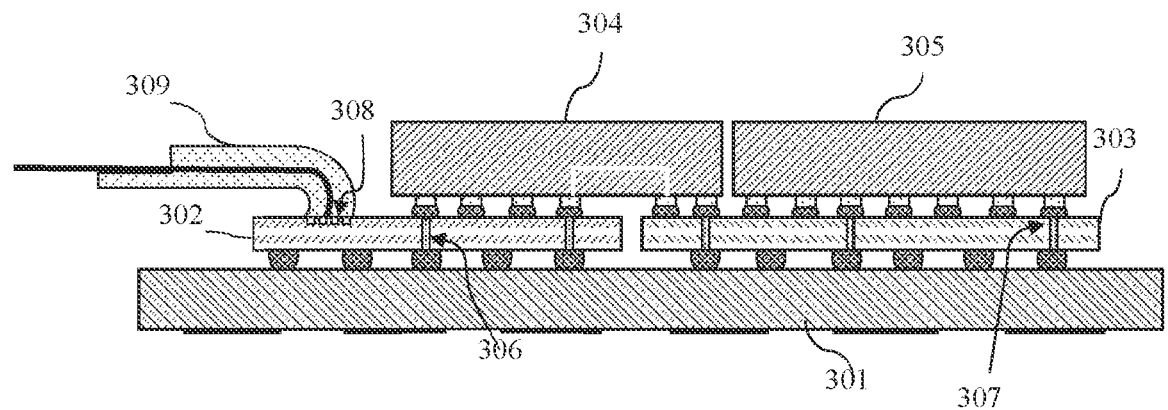
FIG. 3 is a cross-sectional view illustrating the structure of the semiconductor device according to still another embodiment of the present invention.

FIG. 3 illustrates a structure of the semiconductor device according to still another embodiment of the present invention. The semiconductor device includes a substrate 301, a PIC chip 302, an interposer 303, a first EIC chip 304, and a second EIC chip 305. On the substrate 301, a PIC chip 302 and an interposer 303 are mounted side by side. The PIC chip 302 has a first surface facing towards the substrate 301 and a second surface opposite to the first surface. The interposer 303 has a third surface facing toward the substrate 301 and a fourth surface opposite to the third surface. The first EIC chip 304 is connected to both the second surface of the PIC chip 302 and the fourth surface of the interposer 303. That is, a part of the first EIC chip 304 is mounted on the second surface of the PIC chip 302, and another part of the first EIC chip is mounted on the fourth surface of the interposer 303. The second EIC chip 305 is mounted on the fourth surface of the interposer 303. All these EIC chips are mounted on the corresponding PIC chip 302 and interposer 303 through bonding structures such as microbumps, and the PIC chip 302 and the interposer 303 are mounted on the substrate 301 through the bonding structures such as the solder balls.

An electrical connection path from the first EIC chip 304 to the substrate 301 includes the conductive structure 306 in the via as a part of a wiring structure of the PIC chip 302 and the conductive structure 307 in the via as a part of a wiring structure of the interposer 303. A wiring structure of the first EIC chip 304 includes an EIC chip wiring layer, a wiring structure of the PIC chip further includes a PIC chip wiring layer, and a wiring structure of the interposer 303 further includes an interposer wiring layer. The electrical connection path from the first EIC chip 304 to the substrate 301 includes an electrical connection path successively passing through the EIC chip wiring layer of the first EIC chip 304, the PIC chip wiring layer, the conductive structure 306 in the via, and the wiring layer of the substrate 301, and an electrical connection path successively passing through the EIC chip wiring layer of the first EIC chip 304, the interposer wiring layer, the conductive structure 307 in the via, and the wiring layer of the substrate 301. In an alternative embodiment, the electrical connection path from the first EIC chip 304 to the substrate 301 includes any one of the conductive structure 306 in the via and the conductive structure 307 in the via.

An electrical connection path from the second EIC chip 305 to the substrate 301 includes the conductive structure 307 in the via as a part of the wiring structure of the interposer 303. A wiring structure of the second EIC chip 305 includes an EIC chip wiring layer. The wiring structure of the interposer 303 further includes the interposer wiring layer. The electrical connection path from the second EIC chip 305 to the substrate 301 includes an electrical connection path successively passing through the wiring layer of the second EIC chip 305, the interposer wiring layer, the conductive structure 307 in the via, and the wiring layer of the substrate 301.

The wiring structure of the first EIC chip 304 includes the EIC chip wiring layer. The wiring structure of the PIC chip further includes the PIC chip wiring layer. The wiring structure of the interposer 303 further includes the interposer wiring layer. The wiring structure of the second EIC chip 305 includes the EIC chip wiring layer. An electrical connection path from the PIC chip 302 to the second EIC chip 305 may include an electrical connection path successively passing through the PIC chip wiring layer, the EIC chip wiring layer of the first EIC chip 304, the interposer wiring layer, and the EIC chip wiring layer of the second EIC chip 305.

Those skilled in the art should understand that the above-mentioned electrical connection paths also include bonding structures between adjacent components.

In some embodiments, the PIC chip 302 includes a grating coupler 308, through which the PIC chip 302 is coupled to an optical fiber array 309 to couple light from a light source external to a package of the PIC 302. In an alternative embodiment, the grating coupler 308 is coupled to a light redirecting mirror, so as to directly receive light emitted by a laser chip in the package of the PIC 302 through the light redirecting mirror.

In some embodiments, the first EIC chip 304 includes an analog integrated circuit chip and the second EIC chip 305 includes a digital integrated circuit chip. In an alternative embodiment, the first EIC chip 304 includes a digital integrated circuit chip, and the second EIC chip 305 includes an analog integrated circuit chip. In other embodiments, the first EIC chip 304 and the second EIC chip 305 may be a same type of electronic integrated circuit chip, for example, a same analog integrated circuit chip or a same digital integrated circuit chip.

[Photonic Integrated Circuit Chip]

Figure 4:
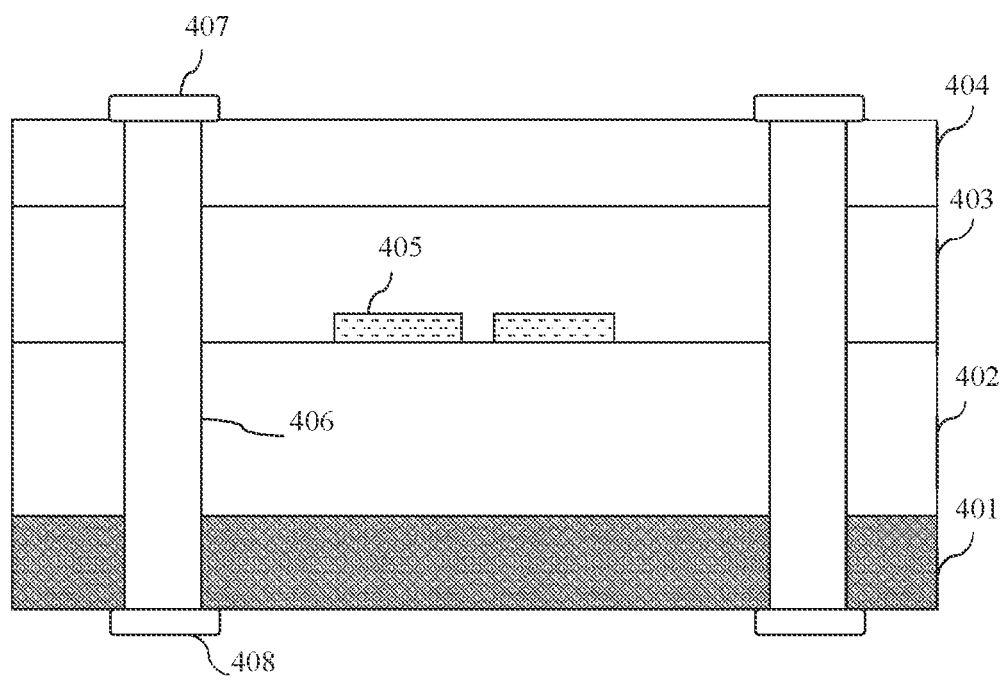
FIG. 4 is a schematic diagram illustrating an example of a conductive structure in a via according to an embodiment of the present invention.

FIG. 4 illustrates an example of a PIC chip and a conductive structure in a via therein according to an embodiment of the present invention. The PIC chip includes a silicon substrate 401, a silicon dioxide layer 402, a first material layer 403, and a second material layer 404 stacked from bottom to top. The device 405 is formed on the silicon dioxide layer 402, which is also called a device layer. In the PIC chip, a conductive structure 406 in a via is formed from top to bottom. An upper end of the conductive structure 406 in the via is provided with a first electrical connection structure 407 for connecting a bonding structure, and a lower end of the conductive structure 406 in the via is provided with a second electrical connection structure 408 for connecting another bonding structure. The conductive structure 406 in the via passes through all layers of the PIC chip. The first electrical connection structure 407 and the second electrical connection structure 408 can be used as a part of a wiring structure of the PIC chip.

Figure 5:
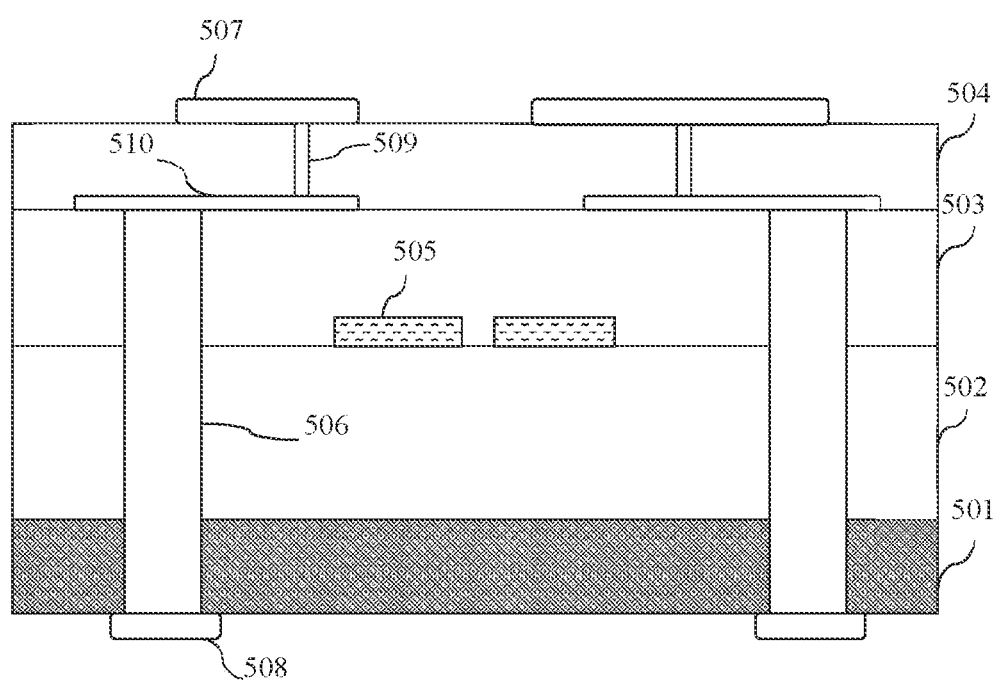
FIG. 5 is a schematic diagram illustrating another example of the conductive structure in the via according to an embodiment of the present invention.

FIG. 5 illustrates another example of the PIC chip and the conductive structure in the via therein according to an embodiment of the present invention. The PIC chip includes a silicon substrate 501, a silicon dioxide layer 502, a first material layer 503, and a second material layer 504 stacked from bottom to top. The device 505 is formed on the silicon dioxide layer 502, which is also called a device layer. In the PIC chip, a conductive structure 506 in a via is formed from top to bottom in the silicon substrate 501, the silicon dioxide layer 502, and the first material layer 503. The conductive structure 506 in the via extends upward from the bottom of the silicon substrate 501 and ends at the bottom of the second material layer 504. That is, the conductive structure 506 in the via passes through three layers including the silicon substrate 501, the silicon dioxide layer 502, and the first material layer 503. The conductive structure 506 in the via passes through a part of the PIC chip, but not through the entire PIC chip. In some embodiments, the conductive structure 506 in the via passes through the substrate 501. On the first material layer 503, a wiring structure may be arranged in the second material layer 504, and the wiring structure is used for connection. Exemplarily, a first wiring structure of the PIC chip may include a first electrical connection structure 507, a first wiring connection layer 509, and a second wiring connection layer 510, and a second wiring structure of the PIC chip may include a second electrical connection structure 508. The first electrical connection structure 507 and the second electrical connection structure 508 are respectively formed on an upper surface and a lower surface of the silicon substrate 501. The first electrical connection structure 507 and the second electrical connection structure 508 can be used to connect to bonding structures. The wiring structure in the second material layer 504 includes the first wiring connection layer 509 connected to the first electrical connection structure 507 and the second wiring connection layer 510 connected to an upper end of the conductive structure 506 in the via.

FIGS. 4-5 only illustrate a location of the device layer by way of example. A device layer may also be formed on other material layers. For example, a device layer may be formed on the second material layer. In some embodiments, a third material layer and a fourth material layer arranged on the second material layer may be further included, and a device layer may be arranged between the third material layer and the fourth material layer. In some embodiments, a device layer may be arranged on a surface of the PIC chip. The device layer may include devices such as optical modulators, optical waveguides, photodiodes, grating couplers, directional couplers, and light-emitting devices, and the optical matrix computing unit may include one or more of the above devices. The light modulators may be, for example, an interconnected Mach-Zehnder interferometer (MZI). In some embodiments, the PIC chip does not include a light source, and light may be input through an external optical fiber or through a light-emitting light source such as a laser. In some embodiments, the PIC chip includes a light source, and the light source may be a semiconductor light-emitting device and a laser device.

In various embodiments, forming of the conductive structure in the via may include a process of forming a via in a PIC chip manufacturing process, and the forming of the via may be performed through TSV technology. In some embodiments, the PIC chip can be formed based on an SOI structure. When the conductive structure in the via in the PIC chip is formed, firstly, the via is formed, then a conductive material is arranged in the via, and the via can pass through the substrate (substrate layer) and other material layers to form the conductive structure in the via, so as to form a conductive path at both ends of the via. When the conductive material is set, a shape of the conductive material does not need to be exactly same as the via, and can be, for example, a shape with a smaller upper part and a larger lower part, as long as conductive paths are formed at both ends of the via. In one or more processes for forming the via, a process utilizing a TSV process may be included.

In FIGS. 4-5, the PIC chip has an upper surface and a lower surface. When the PIC chip is applied to Embodiments 1 to 3, the lower surface is the first surface and the upper surface is the second surface.

The conductive structure in the via formed in the PIC chip used in the various embodiments of the present invention has been described above by way of example. In some embodiments, the conductive structures formed in the via of the interposer can also adopt the structures illustrated in FIG. 4 and FIG. 5. Therefore, the descriptions of the conductive structures in the via of the interposer are not repeated here.

Those skilled in the art should understand that the above disclosure is only embodiments of the present invention, and of course cannot limit the scope of the claims of the present invention, and equivalent changes made according to the embodiments of the present invention are still covered by the scope of the claims of the present invention.

What is claimed is:

1. A semiconductor device, comprising:
    a photonic integrated circuit (PIC) chip comprising a conductive structure in a via;
    a first electronic integrated circuit (EIC) chip arranged on a first surface of the PIC chip; and
    a second EIC chip arranged on a second surface of the PIC chip;
    wherein the first EIC chip is electrically connected to the second EIC chip through the conductive structure in the via of the PIC chip, and
    the first EIC chip comprises an electrical signal conversion unit;
    the PIC chip comprises an optical matrix computing unit and a first wiring structure;
    an electrical signal transmission channel is formed between the second EIC chip and the optical matrix computing unit of the PIC chip.

2. The semiconductor device as claimed in claim 1, wherein:
    the conductive structure in the via in the PIC chip, the electrical signal conversion unit of the first EIC chip, and the first wiring structure of the PIC chip are passed through in sequence along the electrical signal transmission channel in a direction from the second EIC chip to the optical matrix computing unit of the PIC chip; and wherein the electrical signal transmission channel is used for data transmission between the optical matrix computing unit of the PIC chip and the second EIC chip.

3. The semiconductor device as claimed in claim 2, comprising:
    a first bonding structure configured to electrically connect the first EIC chip to the PIC chip, and configured to satisfy that the conductive structure in the via in the PIC chip, the first bonding structure, and the electrical signal conversion unit of the first EIC chip are passed through in sequence along the electrical signal transmission channel in the direction from the second EIC chip to the optical matrix computing unit of the PIC chip.

4. The semiconductor device as claimed in claim 3, comprising:
    a second bonding structure configured to electrically connect the second EIC chip to the PIC chip.

5. The semiconductor device as claimed in claim 4, comprising:
    a third bonding structure configured to electrically connect the first EIC chip to the PIC chip, and to satisfy that the electrical signal conversion unit of the first EIC chip, the third bonding structure, and the first wiring structure of the PIC chip are passed through in sequence along the electrical signal transmission channel in the direction from the second EIC chip to the optical matrix computing unit.

6. The semiconductor device as claimed in claim 1, wherein the conductive structure in the via passes through a part of the PIC chip, but does not pass through the PIC chip.

7. The semiconductor device as claimed in claim 6, wherein the PIC chip comprises a through silicon via, and at least a part of the conductive structure in the via is located in the through silicon via.

8. The semiconductor device as claimed in claim 1, wherein the electrical signal conversion unit is configured to realize conversion between a first electrical signal and a second electrical signal, wherein the first electrical signal is from the PIC chip, and the second electrical signal is output to the second EIC chip.

9. The semiconductor device as claimed in claim 1, wherein the electrical signal conversion unit is configured to realize conversion between a first electrical signal and a second electrical signal, wherein the first electrical signal is from the second EIC chip, and the second electrical signal is output to the PIC chip.

10. The semiconductor device as claimed in claim 1, wherein the PIC chip is configured to receive an electrical signal of the first EIC chip, generate a first optical signal based on electrical signal of the first EIC chip, and perform optical computation by using the first optical signal.

11. A semiconductor device, comprising:
a substrate;
a photonic integrated circuit (PIC) chip comprising a conductive structure in a via, wherein the PIC chip is mounted on the substrate, the PIC chip has a first surface and a second surface, and the second surface faces towards the substrate;
an interposer comprising a wiring structure, wherein the interposer is mounted on the substrate, and the interposer has a third surface facing towards the substrate and a fourth surface opposite to the third surface;
a first electronic integrated circuit (EIC) chip, wherein a part of the first EIC chip is mounted on the first surface of the PIC chip, and another part of the first EIC chip is mounted on the fourth surface of the interposer; and
a second EIC chip mounted on the fourth surface of the interposer.

12. The semiconductor device as claimed in claim 11, wherein the conductive structure in the via in the PIC chip is configured to electrically connect the substrate to the first EIC chip.

13. The semiconductor device as claimed in claim 11, wherein the wiring structure of the interposer is configured to electrically connect the first EIC chip and the second EIC chip.

14. The semiconductor device as claimed in claim 13, wherein:
the first EIC chip comprises an electrical signal conversion unit;
the PIC chip comprises an optical matrix computing unit and a first wiring structure;
an electrical signal transmission channel is formed between the second EIC chip and the optical matrix computing unit of the PIC chip, wherein the wiring structure of the interposer and the electrical signal conversion unit of the first EIC chip are passed through in sequence along the electrical signal transmission channel in a direction from the second EIC chip to the optical matrix computing unit of the PIC chip; and
the electrical signal transmission channel is used for data transmission between the optical matrix computing unit of the PIC chip and the second EIC chip.

15. The semiconductor device as claimed in claim 11, wherein the PIC chip comprises a grating coupler.

16. The semiconductor device as claimed in claim 11, wherein the first EIC chip includes an electrical signal conversion unit, and the electrical signal conversion unit is configured to realize conversion between a first electrical signal and a second electrical signal, wherein the first electrical signal is from the PIC chip, and the second electrical signal is output to the second EIC chip.

17. The semiconductor device as claimed in claim 11, wherein the first EIC chip includes an electrical signal conversion unit, and the electrical signal conversion unit is configured to realize conversion between a first electrical signal and a second electrical signal, wherein the first electrical signal is from the second EIC chip, and the second electrical signal is output to the PIC chip.

18. The semiconductor device as claimed in claim 11, wherein the PIC chip is configured to receive an electrical signal of the first EIC chip, generate a first optical signal based on electrical signal of the first EIC chip, and perform optical computation by using the first optical signal.

* * * * *